United States Patent [19]

Morimoto et al.

[11] Patent Number: 4,755,438
[45] Date of Patent: Jul. 5, 1988

[54] ALUMINUM FILM COATED COPPER MATERIAL

[75] Inventors: Kiyoshi Morimoto, Mobara; Toshinori Takagi, Nagaokakyo, both of Japan

[73] Assignee: Futaba Denshi Kogyo Kabushiki Kaisha, Mobara, Japan

[21] Appl. No.: 99,599

[22] Filed: Sep. 22, 1987

[30] Foreign Application Priority Data

Sep. 26, 1986 [JP] Japan ................... 61-228652

[51] Int. Cl.⁴ .............................. B32B 15/20
[52] U.S. Cl. ...................... 428/652; 428/938
[58] Field of Search ........... 428/607, 652, 938, 586; 204/192.11

[56] References Cited

U.S. PATENT DOCUMENTS

| 4,091,138 | 5/1978 | Takagi et al. | 204/192.11 |
| 4,152,478 | 5/1979 | Takagi | 204/192.11 |
| 4,355,082 | 10/1982 | Bischoff et al. | 428/652 |
| 4,446,197 | 5/1984 | Benko | 204/192.11 |
| 4,521,476 | 6/1985 | Asai et al. | 428/652 |

FOREIGN PATENT DOCUMENTS 166349 1/1986 European Pat. Off. ....... 204/192.11

Primary Examiner—John J. Zimmerman
Attorney, Agent, or Firm—Oblon, Fisher, Spivak, McClelland & Maier

[57] ABSTRACT

An aluminum film deposited copper material capable of being effectively used as a wiring and a heat sink for various electronic elements, an electrical wire, a cable, and the like while preventing diffusion and penetration of copper atoms into a different element. The copper element includes an aluminum film formed on a copper base according to an ion beam deposition techniques. Thus, the aluminum film may be deposited on the copper base with adhesion and denseness sufficient to block diffusion or exudation of copper atoms into the deposited aluminum film. Also, the aluminum film may be deposited in a thickness sufficient to ensure physical and electrical characteristics of copper.

5 Claims, 4 Drawing Sheets

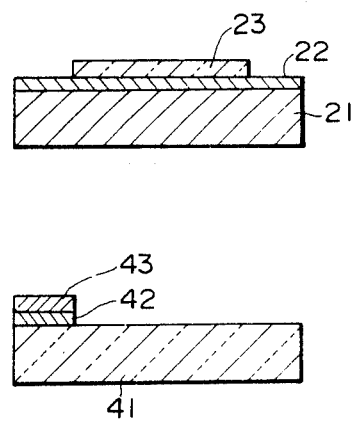
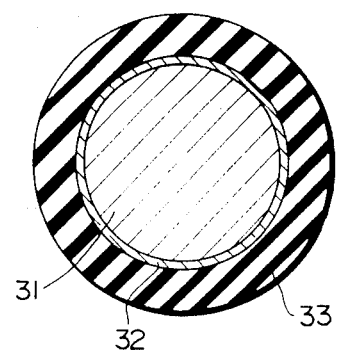

ALUMINUM FILM COATED COPPER MATERIAL

BACKGROUND OF THE INVENTION

1. Field of the Invention

This invention relates to copper material having an aluminum film deposited thereon which is adapted to prevent copper atoms from diffusing and exuding therefrom by means of an extra-thin aluminum film deposited on a surface of the copper material. The aluminum film coated copper material is particularly useful as an electrically-conductive element or a thermally-conductive element.

2. Description of the Prior Art

It is well known in the art that copper has excellent thermal-conduction and electrical-conduction properties, and is extensively used in the manufacture of electrical wire and cable, because its resistivity is as low as 1.72 $\mu\Omega$. cm at a normal temperature and it is produced in large amounts. Also, copper is used as a material for cooling devices, such as, for example, the cooling plate which contacts a heating element, an air-cooled cascade, an air-cooled plate, or the like, because of its high thermal conductivity which is next to silver.

However, copper is chemically reactive with sulfur (S) or the like. For example, if copper is placed in an atmosphere of hydrogen sulfide a film of copper sulfide forms on its surface. Also, when copper is left to stand in air for a long period of time, its surface becomes covered with patina. Further, copper has a disadvantage of being easily corroded by acid. In addition, copper is apt to diffuse. For example, when a copper substrate is used as a heat sink for a semiconductor device where a silicon substrate is mechanically placed in contact with copper substrate, copper atoms diffuse into the silicon substrate as a result of surface contact between both material. This has been a big problem in the semiconductor industry in which severe impurity control is required.

In an case of insulation wires where a copper conductor is covered with rubber, tin plating on the copper conductor is usually employed in view of the fact that copper that is easily corroded by sulfur, and also to prevent diffusion and exudation of copper atoms into the covering insulation material.

Aluminum is known as a material which prevents exudation of copper atoms without deteriorating the characteristics of copper, such as, for example, the thermal conductivity characteristics, the electrical-conductivity characteristics, and the like, and is commercially used as an aluminum cladded copper material which is made by covering a copper rod or wire with a cylindrical aluminum member. However, the conventional aluminum cladded copper material is unable to completely prevent the formation of natural oxide films, stain or the like which form on the surface of copper therefrom, because copper and aluminum are merely mechanically contacted together. Furthermore, aluminum cladding is disadvantageous in that it is difficult to decrease thickness of aluminum clad so that copper may exhibit its flexibility.

SUMMARY OF THE INVENTION

The present invention has been made in view of the foregoing disadvantages of the prior art.

Accordingly, it is an object of the present invention to provide an aluminum film coated copper material in which an extra-thin and dense aluminum film is vapor-deposited on a copper base with high adhesion or bond strength.

It is another object of the present invention to provide an aluminum film coated copper material which is capable of effectively blocking diffusion and exudation of copper atoms and also which prevents penetration of impurities into a copper base.

It is a further object of the present invention to provide an aluminum film coated copper material in which an aluminum film is deposited in an extra-thin thickness sufficient to cause a copper base to exhibit its physical and electrical characteristics.

In accordance with the present invention, there is provided an aluminum film coated copper material. The material includes a copper base of a desired shape. On a surface of the copper base is deposited an aluminum film by ion beam depositing techniques.

In the aluminum film coated copper material prepared, the extra-thin and dense aluminum film is securely vapor-deposited on the surface of the copper base with high bond strength or adhesion. The aluminum film thus deposited serves to block diffusion and/or exudation of copper atoms penetrating therethrough to a different component or material. Also, it blocks impurities or foreign matter from different components penetrating into the copper base.

The deposited aluminum film is extra-thin sufficiently to exhibit satisfactory thermal conduction and electrical conduction, which does not deteriorate the characteristics of copper.

Thus, for example, when the copper material of the present invention is used as a heat sink of a semiconductor element to disperse heat which is generated in a silicon substrate which is placed in contact with the copper material, diffusion of copper atoms into silicon is effectively prevented, while ensuring the heat dissipation characteristics of copper. When the copper material is used for an the manufacture of electrical wire, the deposited aluminum film prevents copper atoms from being exuded therefrom or an impurity from penetrating into the copper material, while maintaining the flexibility of copper. In addition, the aluminum film coated copper material can be used as a wiring conductor for a semiconductor element by, for example, depositing a copper wire in the shape of a thin film on a semiconductor material through a vapor deposited aluminum film.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein:

FIGS. 6(a) to 6(c) each are a schematic sectional view showing an example of application of an aluminum film coated copper material according to the present invention.

DETAILED DESCRIPTION OF THE PREFERRED EMBODIMENT

Now, an aluminum film coated copper material according to the present invention will be described hereinafter with reference to the accompanying drawings.

An aluminum film, which is an essential element in the aluminum film coated copper component of the present invention, is deposited on a copper base with good adhesion to block diffusion of copper atoms. In general, diffusion of an impurity occurs by surface diffusion, intergranular diffusion or bulk diffusion. Copper atoms diffuse from the copper base into the deposited aluminum film mainly by intergranular diffusion and bulk diffusion into the deposited aluminum film. Accordingly, in order to effectively prevent exudation of copper atoms from the copper base, the deposited aluminum film is required to have good adhesion and denseness.

In view of the above, in an embodiment of the present invention, vapor deposition of the aluminum film onto the copper base is carried out by the ionized cluster beam deposition techniques (hereinafter referred to as "ICB deposition techniques").

Figure 1:
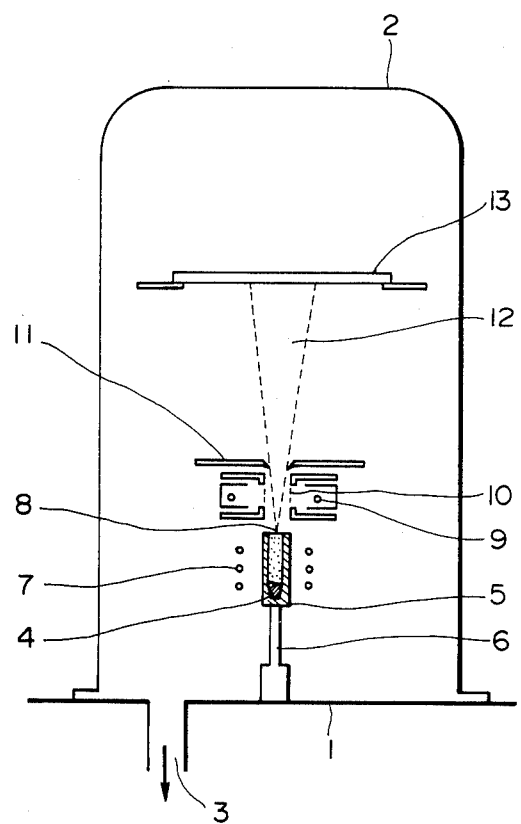
FIG. 1 is a schematic view showing a ICB deposition apparatus which may be used for preparation of an aluminum film coated copper material according to the present invention.

FIG. 1 schematically shows a vapor deposition apparatus for practicing the ICB deposition techniques. The apparatus includes a base plate 1 and a vacuum vessel 2 arranged on the base plate 1. The vacuum vessel 2 is evacuated through an evacuation hole 3 to a reduced pressure of of $10^{-4}$ to $10^{-6}$ Torr. An aluminum material 4 which is to be vapor-deposited is charged into crucible 5 carried on a support rod 6 disposed on the base plate 1 in the vessel 2. The crucible 5 is heated by a suitable heating means 7. In the illustrated embodiment, the heating means 7 comprises a filament arranged to surround the crucible 5. When the crucible 5 is heated, the aluminum material 4 contained in the crucible 5 is vaporized and then outwardly ejected through a nozzle 8 provided at an upper portion of the crucible 5. As a result, clusters comprising aggregated atoms of aluminum are formed due to the difference in pressure between the interior of the crucible 5 and its exterior.

The clusters are passed through an ionization section constituted by a filament 9 and a grid 10 arranged adjacent to the filament 9, during which a part of the clusters is ionized. Subsequently, the ionized clusters are accelerated by an acceleration electrode 11 provided above the grid 10 and then form a cluster beam 12 together with neutral clusters, which is then deposited onto the copper base 13 positioned opposite to the crucible 5.

The ICB deposition techniques utilize kinetic energy and charges of ionized clusters to form a film having good adhesion and less grain boundaries which is sufficient to provide good denseness.

Figure 2:
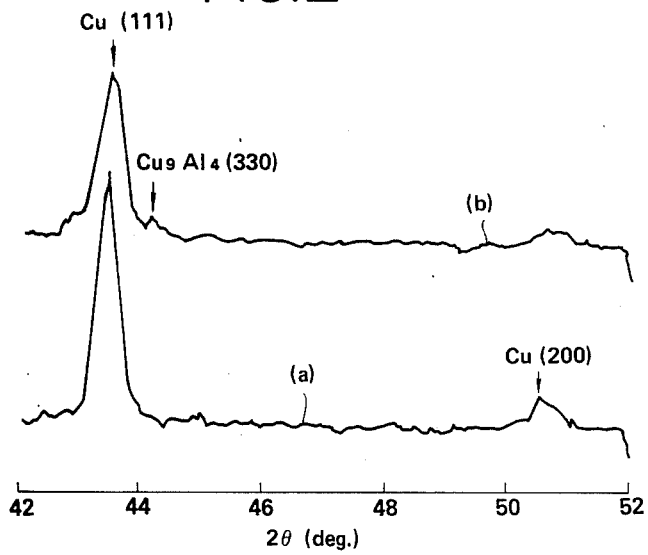
FIGS. 2 to 5 each are a graphical representation showing characteristics of an aluminum film coated copper material according to the present invention in comparison with that prepared according to the conventional deposition process.

FIG. 2 is an X-ray diffraction pattern of an aluminum film of about 1800 Å in thickness which is deposited on the copper base 13 by the ICB deposition techniques which is carried out using the vapor deposition apparatus of FIG. 1 under conditions that the filament current Ie in the ionization section is set at 300 mA and acceleration voltage Va of 5 kV is applied to the acceleration electrode 11. In FIG. 2, (a) indicates an aluminum film deposited according to the ICB deposition techniques and (b) indicates the aluminum film which is subsequently subjected to an annealing treatment.

Figure 3:
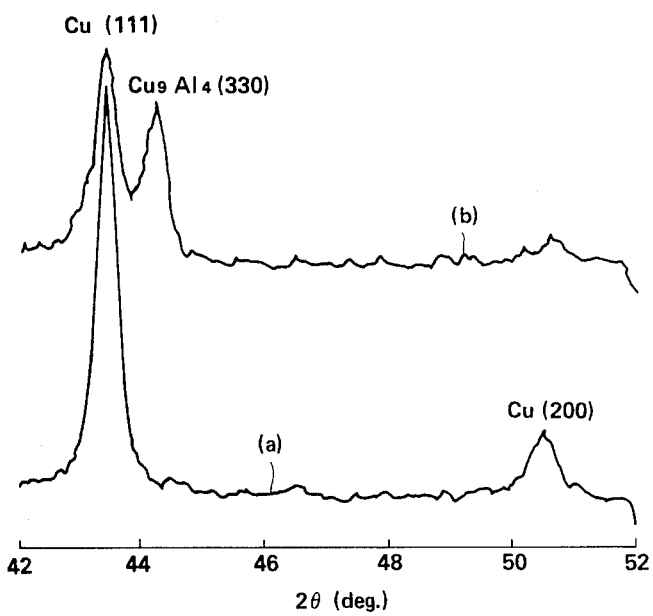

FIG. 3 is an X-ray diffraction pattern of an aluminum film which is deposited to a thickness of about 1800 Å on a copper base by the conventional vacuum deposition, wherein (a) indicates the aluminum film as deposited and (b) indicates the aluminum film which is then subjected to annealing.

As is apparent from a comparison between FIGS. 2 and 3, the conventional vacuum deposition causes the X-ray diffraction peak from the Cu (111) face of the substrate or copper base to decrease after annealing and a peak form $Cu_9Al_4$ (330) face to appear. This indicates that copper atoms exude from the substrate or copper base to the deposited aluminum film which results in forming a copper compound at an interface therebetween.

On the contrary, in the dense aluminum film deposited according to the ICB deposition techniques, as shown in FIG. 2, a peak of the copper compound ($Cu_9Al_4$) is kept low after annealing. Thus, it will be noted that the deposited aluminum film is thermally stable and effectively blocks penetration of copper atoms into the deposition aluminum film.

The results shown in FIGS. 2 and 3 indicates a degree of exudation of copper atoms based on formation of the Cu compound, however, distribution of the copper atoms is not clear from FIGS. 2 and 3. Thus, distribution of aluminum and copper in the thickness direction of the aluminum film deposited on the copper base can be measured according to secondary ion mass spectrometry (hereinafter referred to as "SIMS").

Figure 4:
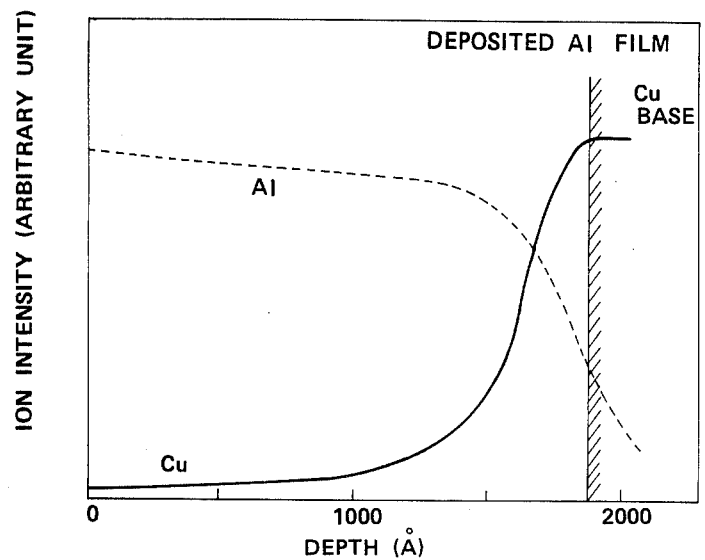
Figure 5:
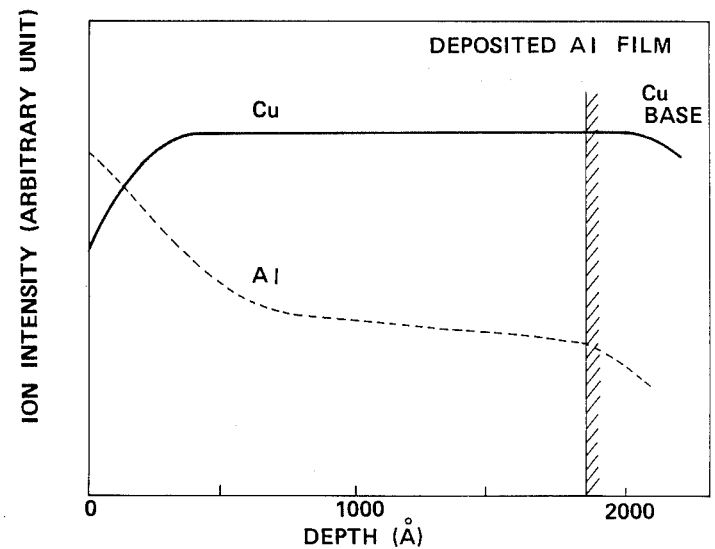

FIGS. 4 and 5 show results of the SIMS. More particularly, FIG. 4 shows results of SIMS on a deposited aluminum film of 1800 Å in thickness formed according to the ICB deposition techniques which takes place at an ionization current Ie of 300 mA and an acceleration voltage Va of 5 kV using the vapor deposition apparatus shown in FIG. 1, wherein an axis of the abscissa indicates the depth of the aluminum film from a surface thereof and the axis of the ordinates indicates an ion intensity (arbitrary unit). As can be seen from the results shown in FIG. 4, the area in which aluminum atoms and copper atoms co-exist appears at an interface between the deposited aluminum film and the copper base. However, the copper atoms are distributed in a manner where the copper atoms decrease toward a surface of the deposited aluminum film. Also, the results indicate that the ion intensity of copper slightly appears in proximity to the surface of the deposited aluminum film. However, this is an intensity out of the detection range of the measuring system. Accordingly, it is concluded that copper atoms do not exist near the surface. Thus, it will be noted that deposition of dense aluminum film in thickness of about 800 Å on the copper base causes the film to effectively block exudation of copper atoms from the copper base to the aluminum film.

On the contrary, in the conventional vacuum deposition, as shown in FIG. 5, distribution of copper atoms in the deposited aluminum film is substantially equal to that in the copper base substantially throughout the whole aluminum film. Thus, FIG. 5 more clearly indicates that deposition of the dense aluminum film onto the copper base according to the present invention effectively blocks penetration of copper atoms from the substrate or copper base to the aluminum film.

Analysis by SIMS does not indicate an absolute comparison between different materials, because it is varied in a ratio of discharge of a secondary ion, an etching rate and the like depending on a material. Accordingly, the ratio or difference of intensity between aluminum and copper in FIGS. 4 and 5 does not necessarily indicate a composition ratio therebetween. However, it is deemed that a difference in intensity of the material proportionally indicates a difference in distribution of the material if the material is the same. Thus, it is belived that a difference in intensity of copper between FIGS. 4 and 5 indicates a difference in distribution of copper in the deposited aluminum film therebetween.

Now, examples of application of the aluminum film coated copper material according to the present invention will be described hereinafter with reference to FIG. 6.

FIG. 6(a) schematically illustrates an example of application of the present invention wherein the copper material of the present invention is used as a heat sink for a semiconductor element. In FIG. 6(a), reference numeral 21 and 22 designate a flat plate-like copper base and an aluminum film densely deposited on a surface of the copper base 21 with good adhesion by ion beam deposition techniques such as ICB deposition techniques, thereby forming the heat sink. In the example, a thickness of the deposited aluminum film 22 may be as small as 1000 Å in view of the results shown in FIG. 4, however, it is preferably about 1 μm in order to more effectively accomplish blocking of penetration of copper atoms.

Then, a silicon chip or IC substrate 23 on which a semiconductor element is formed is arranged on the heat sink, which effectively functions in designating heat from the semiconductor element. Also, the deposited aluminum film 22 positively blocks exudation of copper from the copper base 21, there preventing contamination of the semiconductor element with copper atoms.

FIG. 6(b) illustrates another example of application of the present invention, wherein the copper material of the present invention is applied to an electrical wire or cable. A deposited aluminum film 32 is formed on a surface of a cylindrical copper base or conductor 31. The aluminum film 32 is preferably deposited in a thickness of 1 μm or less so that flexibility of the copper conductor 31 will not deteriorate. Then, an insulation film 33 formed of a suitable material such as, for example, a plastic material is arranged around the aluminum film 32.

Such construction permits the deposited aluminum film 32 to effectively block exudation of copper atoms from the copper conductor 31, whereby deterioration of the insulation film 33 due to penetration of copper atoms is prevented.

FIG. 6(c) illustrates a further example of application of the present invention which is so constructed that an aluminum film blocks exudation of copper atoms from a copper film. More particularly, in the example, an aluminum film 42 is deposited on a silicon substrate 41 and then a copper film 43 is fornmed on the aluminum film 42. The copper film 43 thus formed is used as a wiring for a semiconductor element formed on the silicon substrate.

In each of the examples, the deposited aluminum film is formed by the ion beam deposition techniques, which exhibits good adhesion and denseness. Thus, intergranular diffusion and bulk diffusion of copper atoms may be substantially blocked, thereby preventing components or elements other than copper from being contaminated by copper atoms.

In the above example, the conditions for ionization and acceleration in the aluminum film deposition are optimally determined depending on the ion beam deposition techniques employed, the thickness of the deposited aluminum film to be formed and the like. Thus, the present invention is not limited to the above described conditions.

As can be seen from the foregoing, in the aluminum film coated copper material, the aluminum film deposited on the copper base with satisfactory adhesion and denseness is effective in blocking diffusion or exudation of copper atoms into the deposited aluminum film. Also, the aluminum film may be deposited in a thickness as small as 1 μm or less. Accordingly, the physical and electrical characteristics of copper do not deteriorate.

Thus, it will be noted that the aluminum film coated copper material of the present invention may be effectively used as a wiring and a heat sink for various electronic elements, electrical wire, cable, and the like, while preventing diffusion and penetration of copper atoms into a different element.

While a preferred embodiment of the invention has been described with a certain degree of particularity with reference to the drawings, obvious modifications and variations are possible in the light of the above teachings. It is therefore to be understood that within the scope of the appended claims, the invention may be practiced otherwise than as specifically described.

What is claimed as new and desired to be secured by Letters Patent of the United States is:

1. A copper base having an aluminum film comprising:
   a copper base; and
   an aluminum film having been deposited on a surface of said copper base by ion beam deposition techniques.

2. The copper base having an aluminum film as defined in claim 1, wherei said aluminum film has been deposited in a thickness of 1 μm or less.

3. The copper base having an aluminum film as defined in claim 1, wherein said copper base is a flat plate shape.

4. The copper base having an aluminum film as defined in claim 1, wherein said copper base is a cylindrical shape.

5. The copper base having an aluminum film as defined in claim 1, wherein said copper base is a film.

* * * * *